(12) United States Patent
Ma et al.

(10) Patent No.: US 6,906,371 B2
(45) Date of Patent: Jun. 14, 2005

(54) WORDLINE GATE CONTACT FOR AN MBIT TRANSISTOR ARRAY LAYOUT

(75) Inventors: Daivid SuitWai Ma, Cary, NC (US); Guenter Gerstmeier, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 157 days.

(21) Appl. No.: 10/217,839

(22) Filed: Aug. 12, 2002

(65) Prior Publication Data

US 2004/0026763 A1 Feb. 12, 2004

(51) Int. Cl.⁷ .................. H01L 27/108; H01L 29/76; H01L 29/94; H01L 31/119
(52) U.S. Cl. ...................... 257/296; 257/908
(58) Field of Search ............................ 257/295, 296, 257/303, 306, 307, 308, 310, 906, 907, 908; 438/239, 240, 253, 254, 396, 397, 398

(56) References Cited

U.S. PATENT DOCUMENTS

| | | | |
|---|---|---|---|
| 4,988,637 A | 1/1991 | Dhong et al. | |
| 5,598,367 A | 1/1997 | Noble | |
| 5,646,061 A | 7/1997 | Wang et al. | |
| 5,812,448 A * | 9/1998 | Wen ............. | 365/182 |
| 5,932,908 A | 8/1999 | Noble | |
| 6,021,063 A | 2/2000 | Tai | |
| 6,031,773 A | 2/2000 | Taylor | |
| 6,107,139 A | 8/2000 | Tu et al. | |
| 6,124,199 A | 9/2000 | Gambino et al. | |
| 6,201,272 B1 | 3/2001 | Kotecki et al. | |
| 6,271,555 B1 | 8/2001 | Hakey et al. | |
| 6,349,052 B1 | 2/2002 | Hofmann et al. | |
| 6,352,894 B1 | 3/2002 | Goebel et al. | |
| 6,355,954 B1 | 3/2002 | Gall et al. | |
| 6,362,502 B1 | 3/2002 | Rösner et al. | |
| 6,395,594 B2 | 5/2002 | Kotecki et al. | |

* cited by examiner

Primary Examiner—Hoa Pham
(74) Attorney, Agent, or Firm—Brinks Hofer Gilson & Lione

(57) ABSTRACT

A DRAM memory unit contains a memory bit (mbit) transistor and a capacitive region for storing charge. The memory is configured to store data as a charge stored by the capacitive region. Each memory unit is accessed by an associated wordline and the data stored by the memory unit is read from an associated bitline connected to the memory unit. The memory units are connected to the associated wordline via a wordline contact and connected to the associated bitline via a bitline contact. The memory units are arranged in memory unit clusters that include multiple memory units having a common bitline contact. The wordline contact is configured to provide for orientation of the wordlines in the memory array independent of the orientation of the bitlines. The wordline contact is also configured to provide for at least one wordline layer separated from the memory unit by a height of the wordline contact. The wordline contact may be further configured to provide an upper wordline layer and a lower wordline layer each being above the bitline relative to the memory unit.

26 Claims, 6 Drawing Sheets

WORDLINE GATE CONTACT FOR AN MBIT TRANSISTOR ARRAY LAYOUT

BACKGROUND OF THE INVENTION

1. Field of the Invention

The present invention relates generally to semiconductor integrated circuit devices, and in particular, the present invention relates to devices such as electronic memory arrays.

2. Description of the Related Art

Design improvements are being made for modern families of integrated circuits (IC's) to decrease the size of the IC by increasing the density with which the IC may be laid out. Decreases in size are desirable to minimize manufacturing costs for the IC, and thereby reduce the costs of equipment employing the IC. The overall size of the IC is reduced through layout improvements that allow tighter packing of the devices that make up the IC. Tighter packing of the devices allows the IC to occupy less space on the die on which the IC is laid out. Because the die occupies less space, more dies can be cut from a single wafer from which the die is cut. Accordingly, a single wafer can produce more dies (IC's) and the overall cost for the IC is reduced. Tighter packing, and increased density, is also desirable to allow for added circuitry to the IC without increasing the size of the die, as well as for increased speed with which the IC may operate.

IC's incorporating digital logic circuits and memory arrays are commonly implemented with n-channel type metal-oxide-semiconductor transistors (NMOS transistor), which is a three terminal device having 1) a drain; 2) a source; and 3) a gate. The NMOS transistor has advantages of small size, low power consumption, high input impedance, and relatively low fabrication costs. An NMOS transistor may be fabricated with a silicon substrate material that generally is heavily doped to form a channel between two wells (e.g. a p-type silicon substrate can be doped to form two heavily doped n+ wells and a channel between the wells). Each well may be referred to as a source/drain region. A conductive material may be placed in contact with the well to form electrical contact with the source/drain regions, and a thin oxide layer is disposed on the surface of the channel, and metal is deposited on the oxide layer to form the gate. An electric field applied to the channel by a potential at the gate controls an electrical current between the source/drain regions. The oxide layer acts as an insulator to minimize current flow to the gate.

Common memory packages, known as dynamic random access memory (DRAM or DRAM), conventionally include numerous units of memory each configured to store a bit of data and arranged in an memory array. Each unit of memory typically includes one NMOS transistor—commonly referred to as a memory bit (mbit transistor)—serially connected to a capacitive region. Each memory unit stores data as charge stored in the capacitive region and is connected to an associated bitline and associated wordline. The wordlines and bitlines are typically a conductive material that crosses the memory array. Each wordline and bitline may be connected to multiple units of memory via the mbit transistor. Multiple memory units having a common wordline may make up a word of data. Each wordline may be connected to part of a word of data or multiple words of data. The wordline is connected to the gate of the mbit transistor for each memory unit and the bitline is connected to a first source/drain region of the mbit transistor via bitline contact. A second source/drain region is connected to the capacitive region of the memory unit. Each bitline is coupled to a sense amplifier, which detects voltage on the bitline to translate the voltage to logical data.

The memory unit is accessed by activating the mbit transistor. To read all memory units on a wordline, the associated wordline is accessed to activate the mbit transistor of each memory unit coupled to the wordline. The mbit transistor couples the capacitive region to the associated bitline. A charged capacitive region causes a positive voltage on the bitline and a discharged capacitive region causes substantially no voltage or negative voltage on the bitline relative to a reference voltage. The voltage on the bitline is amplified by the sense amplifier connected to the bitline and a logical bit of data stored by the memory unit can thereby be detected at the output of the sense amplifier. In one convention a logical "1" may be represented as charge stored by the memory unit, while a discharged capacitor represents logical "0." Data is written by providing bursts of electrical current to charge or discharge the capacitive region via the bitline. For example, when a memory unit having a charged capacitive region is accessed, a logical "1" can be read and when a memory unit having a discharged capacitive region is accessed, a logical "0" can be read. The convention employed is dependent on the polarity of the sense amplifier attached to the bitline. Accordingly, in another convention, a logical "0" may be represented by a charge stored by the memory unit and a logical "1" is represented by a discharged unit.

The combination, proximity, and orientation of the mbit transistors, bitline contacts and capacitive regions are carefully laid out so as to minimize the size of the memory array. In a conventional DRAM memory array design, two adjacent memory units may share a common bitline contact, thereby forming a memory unit cluster. In conventional memory array designs, an mbit transistor may be formed by auto-generation, in which the mbit transistor is formed on a diffusion area between a bitline contact and a capacitive region. Because the wordline defines the location of mbit transistor and other components of the memory array, conventional memory array layouts are limited to a maximum of two mbit transistors having a common bitline contact. Minimizing the dependence on the wordline would allow tighter packing of the memory units (i.e. higher densities) and allow additional memory units to share a common bit line contact. Accordingly, there is a need for an improved layout of mbit transistors for tighter packing and increased memory storage capacity of an IC.

BRIEF SUMMARY

The above problems have been solved with the present invention. By way of introduction only, an advantage of the present invention is to reduce the effects of auto-generation in tightly-packed memory arrays and thereby increase density of the memory array and decrease costs of the IC. By increasing the density of the memory array, the advantage of decreasing the size of the memory package may be achieved.

Another advantage is to incorporate a wordline contact between the mbit transistor and the corresponding wordline. The wordline contact and an oxide layer forming the gate and provide for a wordline that is removed from the gate forming oxide layer and thereby minimize the limitations of auto-generation.

It is another advantage of the present invention to incorporate a memory array wherein more than two memory units form a memory unit cluster and share a common bit line contact.

It is another advantage to incorporate a wordline layer that is removed from the gate forming oxide layer. The wordline layer includes multiple wordlines and each wordline is connected to associated memory units via wordline contacts. The wordline contacts and a dielectric oxide layer form the gate for each mbit transistor of the memory unit. The wordlines in the wordline layer run orthogonal to the bitlines of the memory array.

It is another advantage to incorporate a wordline layer having multiple wordlines removed from the oxide layer in contact with an mbit transistor, wherein wordlines are oriented independent of the orientation of the bitlines and other wordlines of the memory array.

It is another advantage to incorporate at least two wordline layers that are distally located from the oxide layer.

These and other advantages are achieved by providing a DRAM semiconductor memory or memory array using a wordline contact. The memory array includes multiple memory units that store logical data as units of electrical charge. The memory units are accessed via wordlines and bitlines that run across the memory array. Each memory unit includes a memory bit (mbit) transistor that is serially connected to a capacitive region, commonly referred to as a memory cell. Both the mbit transistor and the capacitive region are formed in the silicon substrate material. The data is represented as electric charge stored by the capacitive region. The mbit transistor includes a first and a second source/drain region, together forming a first channel region adjoining a surface of the silicon substrate material between the first and second source/drain region. A dielectric layer is disposed at the surface of the silicon substrate material at the channel region. The corresponding wordline is connected to the dielectric layer via a wordline contact, and thereby the wordline contact and the dielectric layer form the gate of the mbit transistor. The first source/drain region is connected to a bitline contact which is connected to the corresponding bitline. The data is accessed by switching the mbit transistor via the wordline to couple the capacitive region to the corresponding bitline. When the memory unit is accessed, the capacitive region is coupled to the bitline via the bitline contact. The data stored by the memory unit is read from the bitline from an amount of voltage applied to the bitline by the coupling of the capacitive region to the bitline.

The memory units may be arranged in pairs, wherein each pair has a common bitline contact and at least one of the memory units has a wordline contact. The memory units may also be arranged in memory unit clusters including three or more memory units each having a common bitline contact and wherein one memory unit, two memory units, or each memory unit has a wordline contact. The wordline contact forms the gate for each corresponding mbit transistor and provides for a wordline layer that is removed from the substrate material.

The foregoing discussion of the summary is provided only by way of introduction. Nothing in this section should be taken as a limitation on the claims, which define the scope of the invention. Additional advantages will be set forth in the description that follows, and in part will be obvious from the description, or may be learned by practice of the present invention. The advantages may be realized and obtained by means of the instrumentalities and combinations particularly pointed out in the claims.

DETAILED DESCRIPTION OF THE PREFERRED EMBODIMENTS

Figure 1:
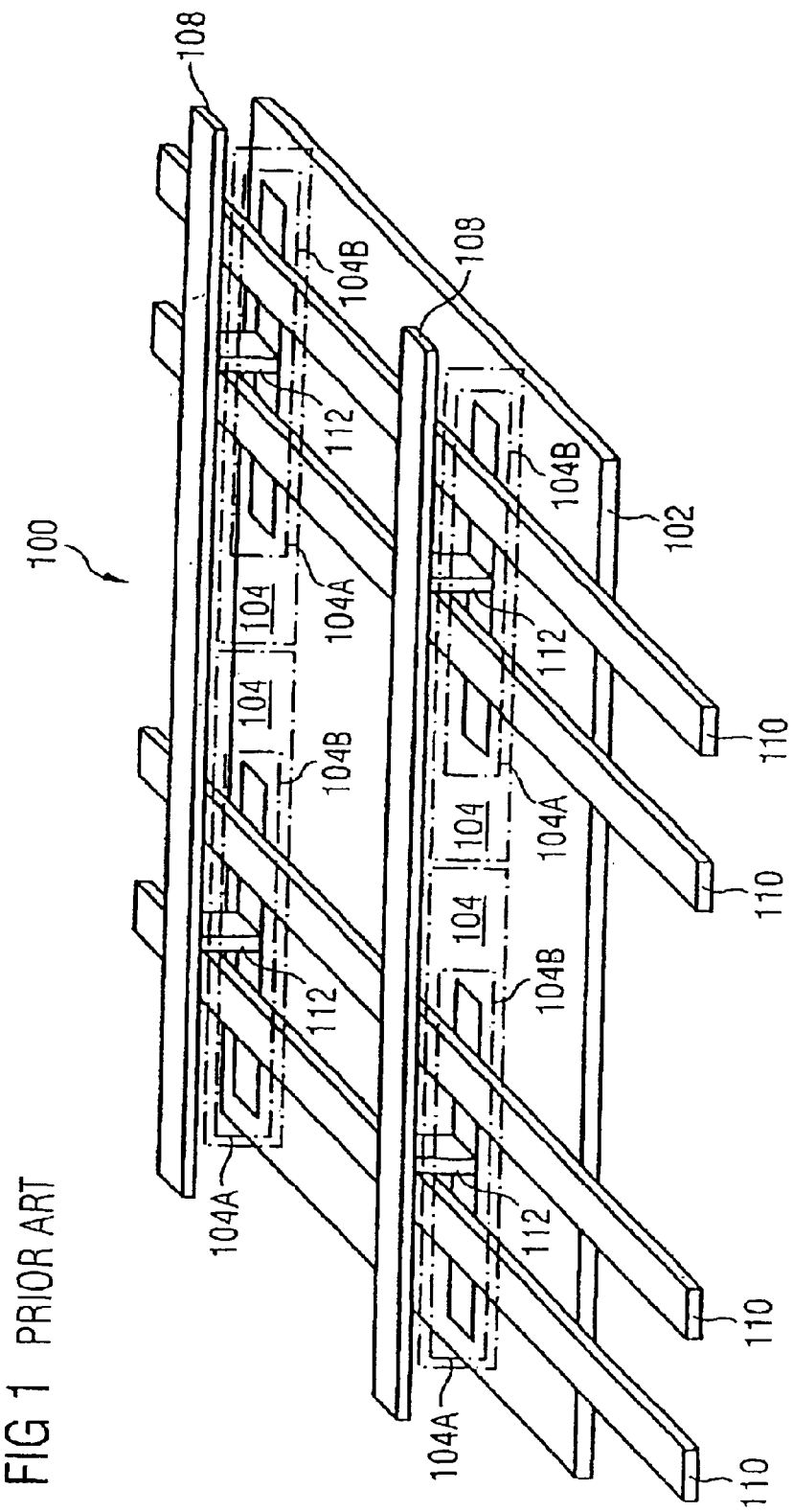
FIG. 1 illustrates a perspective view of a plurality of memory units in a prior art memory array.

In each of the following figures, components, features and integral parts that correspond to one another each have the same reference. The figures of the drawing are not true to scale.

A semiconductor integrated circuit memory or memory array includes multiple memory units generally configured in rows and columns. Each of the memory units is connected to a wordline and a bit line. A row of memory units (collectively a "Wordline" of data) is accessed by the wordline and the data stored by each memory unit (Bit) connected to the wordline is read from the bitline, which forms the columns of the memory array. The wordline may include part of a word of data or multiple words of data. By way of example, a word of data may include 16 or 32 bits of data and the wordline may be able to access more than 4k bits of data.

FIG. 1 illustrates a portion of a prior art semiconductor integrated circuit (IC) memory array 100. The memory array 100 can be a semiconductor memory such as a dynamic random access memory ("DRAM") or part of a semiconductor integrated circuit having or other electronic circuits, such as a processor circuit having a component memory array 100. The memory array 100 includes multiple memory units 104A, 104B, multiple wordlines 110, and multiple bitlines 108. Adjacent memory units 104A, 104B form a memory unit cluster 104 and share a common bit line contact 112. Each memory unit 104A, 104B is formed in a silicon substrate material 102. Each bitline is in electrical contact with the associated memory units 104A, 104B via the bitline contact 112. An individual memory unit 104A, 104B is accessed via an associated wordline 110 and the data stored by the memory unit 104A, 104B is read from the bitline 108. The wordlines 110 run in a plane that is proximate to the surface of the silicon substrate material 102 and separated by a thin dielectric material. The wordlines 108 conventionally run substantially orthogonally to the bitlines 108, which may run in a plane that is distally located from the plane having the wordlines 110, relative to the surface of the silicon substrate material 102. The memory array may include various insulating layers (not shown) to electrically isolate the wordlines, bitlines and portions of the substrate material 102. These insulators are not shown in the figures so as not to unduly complicate the drawings.

Figure 2:
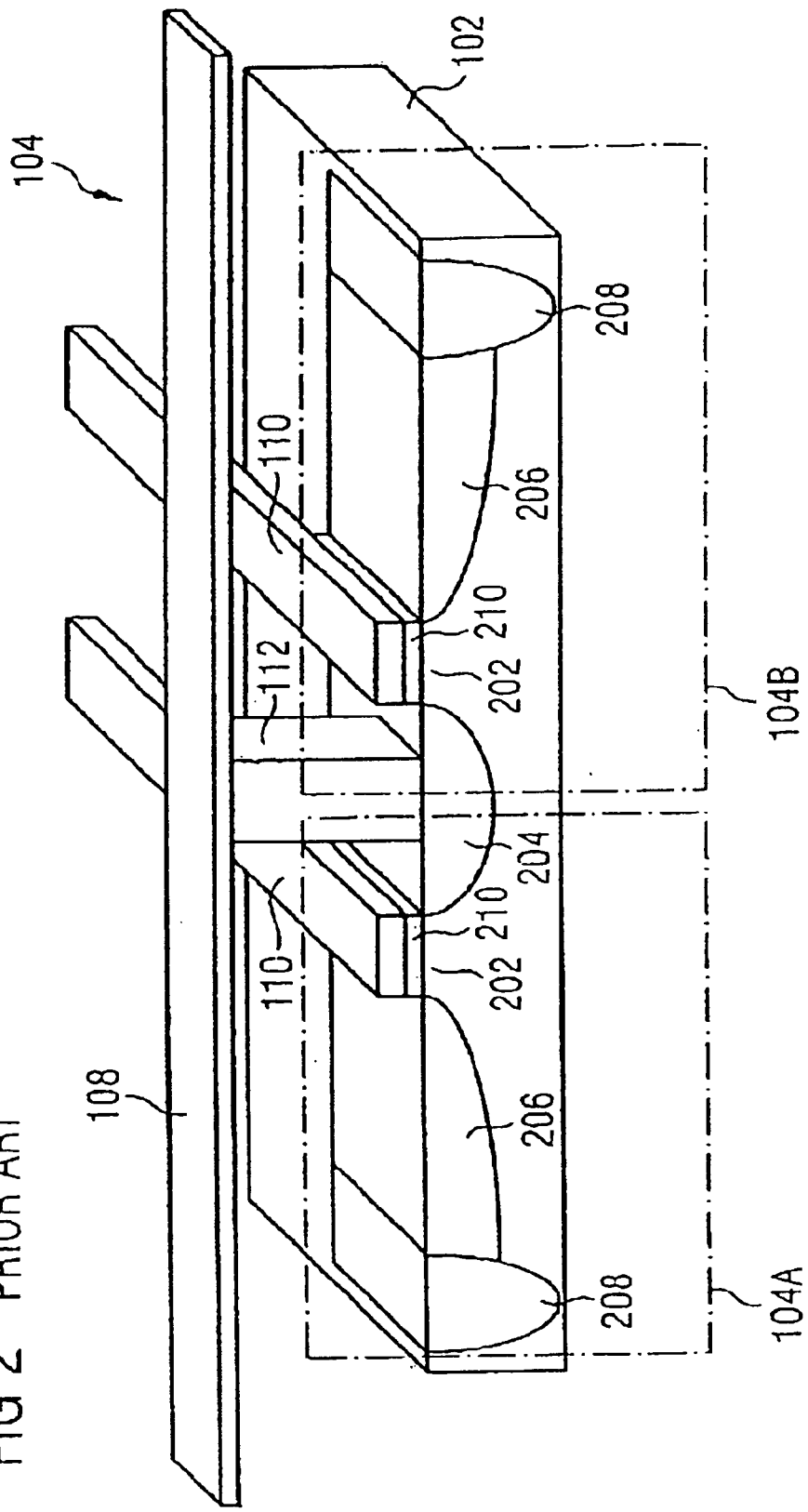
FIG. 2 illustrates a perspective view in cut-away of a conventional pair of memory units having a common bitline contact.

Referring now to FIG. 2, a portion of a prior art memory unit cluster 104 is shown. The memory unit cluster 104 includes two adjacent memory units 104A, 104B each sharing a common bitline contact 112. Each memory unit 104A, 104B, includes a memory bit (mbit) transistor serially connected to a capacitive region 208, commonly referred to as a memory cell. The mbit transistor includes a first source/drain region 204 and a second source/drain region 206 formed in a silicon substrate material 102, which is commonly a p-doped silicon. Insulating structures (not illustrated) may be provided to isolate mutually adjacent components from one another.

The first source/drain region 204 is common to both of the memory units 104A, 104B. The first source/drain region 204 and the second source/drain region 206 form a channel region 202. The channel region 202 is characterized by the distance between the first source/drain region 204 and the second source/drain region 206—commonly called the channel length. The channel region 202 is formed at a surface of the silicon substrate material 102 between the first source/drain region 204 and the second source/drain region 206. A dielectric layer 210, conventionally a thin metal-oxide, is disposed at the surface of the silicon substrate material 102 at the channel region 202. The dielectric layer 210 may be disposed at the surface of the silicon substrate material 102 for at least the length of the channel region 202. The wordline 110 is in contact with the dielectric layer 210. The wordline 110 and the dielectric layer 210 form the gate of the mbit transistor. Together, the first source/drain region 204, the second source/drain region 206 and the gate form the mbit transistor for the memory unit 104A, 104B.

Each memory unit 104A, 104B in the memory unit cluster 104 share a common bit line contact 112 in electrical contact with the first source/drain region 204. The bitline 108 may be electrically connected to the first source/drain region 204 via the bitline contact 112. The second source/drain region 206 is electrically coupled to the capacitive region 208. The capacitive region 208 is formed using known techniques for forming a trench capacitor.

Data is represented in the form of an amount of electric charge stored in the capacitive region 108. The memory unit 104A, 104B is accessed by activating the mbit transistor via the associated wordline 110. When the mbit transistor is activated, the channel region 202 may conduct current, and thereby couple the second source/drain region 206 to the first source/drain region 204. With the first source/drain region 204 and the second source/drain region 206 coupled, a voltage due to charge stored in the capacitive region 208 may be applied to the bitline 108. When the capacitive region 208 is charged, a voltage is imposed on the bitline 108, while when the capacitive region 208 is not charged, no or negative voltage relative to a reference voltage is imposed on the bitline 108. Sense amplifiers (not shown) are connected to the bitline 108 and are configured to amplify the voltage on the bitline to determine the charge in the capacitive region 208, and therefore the state of the memory unit 104A, 104B. In an embodiment, electric charge stored in the capacitive region represents a logic "1" and a depleted capacitive region represents a logic "0." Accordingly, a logical "1" is read when the wordline 110 is activated and the amplifier detects a voltage on the corresponding bitline 108, and a logical "0" is detected when there is not voltage detected on the bitline 108.

Figure 3:
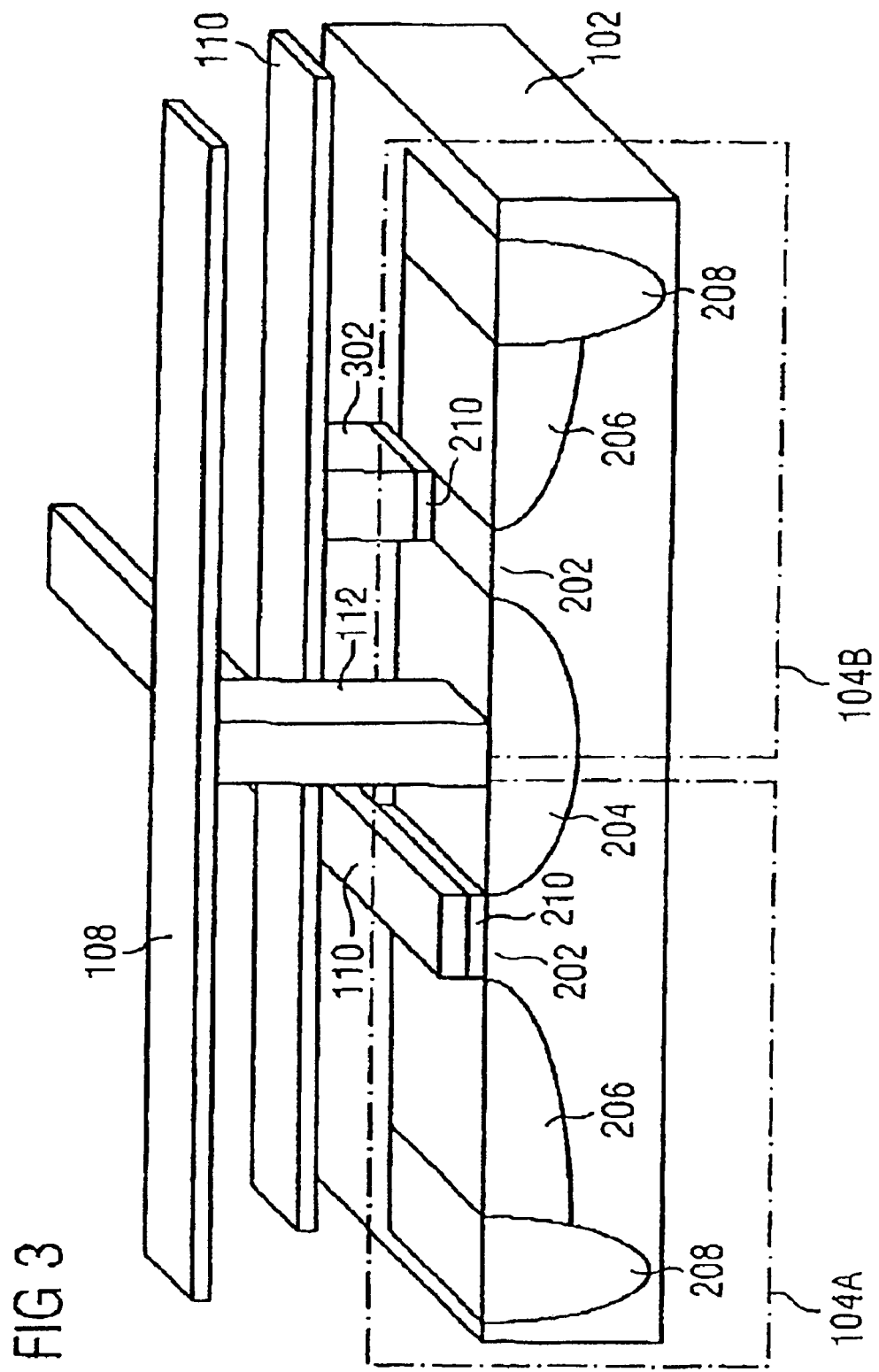
FIG. 3 illustrates a perspective view in cut-away of a memory unit having a wordline contact.

Referring now to FIG. 3, a memory unit cluster 104 including two adjacent memory units 104A, 104B having a common bitline contact 112 and wherein at least one memory unit 104B having a wordline contact 302 is shown. Each memory unit 104A, 104B includes an mbit transistor serially connected to a capacitive region 208. The mbit transistor includes a first source/drain region 204 and a second source/drain region 206 formed in a silicon substrate material 102 that is typically a p-doped silicon material. Insulating structures (not illustrated) may be provided to isolate from one another mutually adjacent components.

The first source/drain region 204 is common to both of the memory units 104A, 104B. The first source/drain region 204 is connected to the bitline 108 via the common bitline contact 112. The second source/drain region 206 is electrically coupled to the capacitive region 208. The first source/drain region 204 and the second source/drain region 206 form a channel region 202, characterized by the channel length. The channel region 202 adjoins the surface of the silicon substrate material 102 between the first source/drain region 204 and the second source/drain region 206. The dielectric layer 210, may be disposed at the surface of the silicon substrate material 102 for at least the length of the channel region 202.

At least one memory unit 104B is connected to a wordline 110 associated with the memory unit via the wordline contact 302. The wordline contact 302 is disposed between the associated wordline 110 and the dielectric layer 210. The wordline contact 302 and the dielectric layer 210 form the gate of the mbit transistor. The wordline contact 302 provides electrical contact from the wordline 110 to the dielectric layer 210. The wordline contact 302 further provides for distancing the associated wordline 110 from the surface of the silicon substrate material 102. The associated wordline 110 that is connected to the memory unit 104B via a wordline contact 302 may run in a plane that is distally located from the associated wordline 110 for the adjacent memory unit 104A of the memory unit cluster 104. The associated wordline 110 connected to the memory unit 104B via a wordline contact 302 may also be distally located from the plane containing the bitlines 108, relative to the surface of the silicon substrate material 102. To allow tighter packing of the memory units, the wordline 110 that is connected to the memory unit 104B via a wordline contact 302 may run parallel, or at angles other than right angles, to the bitlines 108.

The wordline contact 302 is formed so as to minimize any resistance between the wordline 110 and the dielectric layer 210. The wordline contact 302 is a conductive material, such as a metallized polysilicon material or other known conductive material having a low resistivity (high conductivity) commonly used in integrated circuits. The wordline contact 302 may be similar conductive material as the wordline 110 or other materials commonly used as contact material. The wordline contact 302 may also taper from a wide portion in contact with the wordline 110 to a narrower portion that is in contact with the dielectric layer 210.

Figure 4:
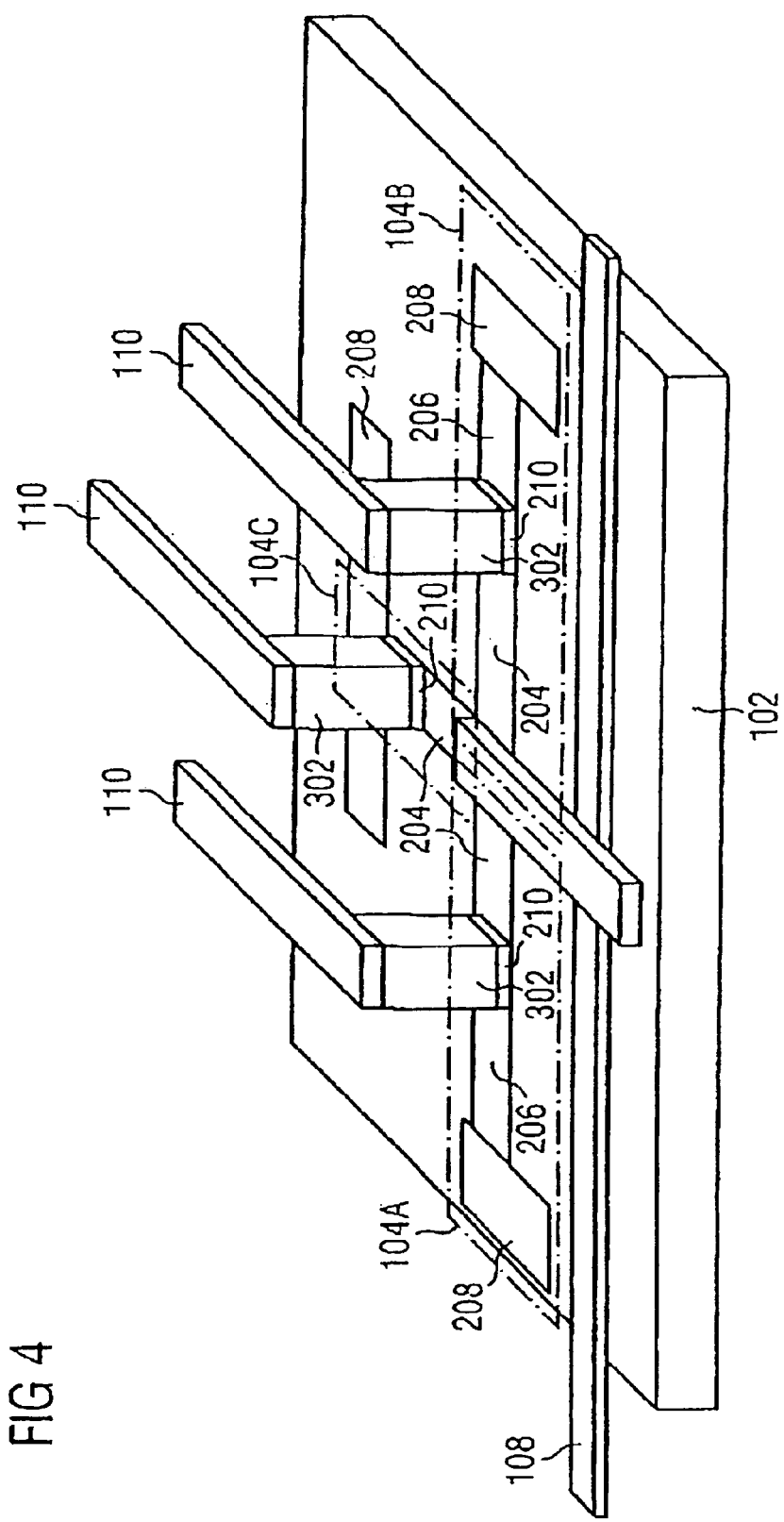
FIG. 4 illustrates a perspective view of a memory unit cluster having wordline contact and a common bitline contact.

Referring now to FIG. 4, a memory unit cluster 104 including three adjacent memory units 104A, 104B, 104C having a common bitline contact 112 is shown. The memory units 104A, 104B, 104C each include an mbit transistor having a first source/drain region 204, a second source/drain region 206, and a gate formed by the wordline contact 302 and the dielectric layer 210. The first source/drain region 204 is common to each memory unit 104A, 104B, 104C and the second source/drain region 206 is particular to the memory unit 104A, 104B, 104C. Each mbit transistor is serially connected between the bitline 108 and the capacitive region 208. The bitline contact 112 is disposed between and in electrical contact with the first source/drain region 204 and the bitline 108.

Each memory unit 104A, 104B, 104C is accessed by the associated wordline 110 via a wordline contact 302 which is disposed between the associated wordline 110 and the dielectric layer 210. The wordlines 110 may run in a common plane that is disconnected from the surface of the silicon substrate material 102 and is distally located above the bitlines 108, relative to the surface of the silicon substrate material 102. The wordlines 110 may be configured to run parallel with, or at other angles to, the bitline 108.

The memory unit cluster having three adjacent memory units 104A, 104B, 104C with a common bitline contact 112 may be packed tighter and may have a higher density than memory unit clusters having two adjacent memory units with a common bitline contact 112. By way of example, with three adjacent memory units 104A, 104B, 104C sharing a common bitline contact 112, the data stored in six memory units 104A, 104B, 104C may be accessed by only two bitlines 108. Accordingly, each memory unit cluster 104 in the memory array 100 may provide for storage of at least one additional bit of data.

The memory units 104A, 104B, 104C may be configured in a "T-Shaped" configuration having a center and three extensions connected to the center. In an embodiment, two memory units 104A, 104B are at 180 degrees with respect to each other and the third memory unit 104C is at 90 degrees from each of the two memory units 104A, 104B. The first source/drain region 204 may be located substantially at a center of the "T" and the second source/drain region 206 and the capacitive region 208 of each of the three adjacent memory units 104A, 104B, 104C form one of the three extensions. The bitline contact 112 may be formed so as to offset the bitline from a line connecting the two memory units 104A, 104B at 180 degrees to each other. In another embodiment, the memory units 104A, 104B, 104C may be at other angles, such as 60 degrees from each other.

Figure 5:
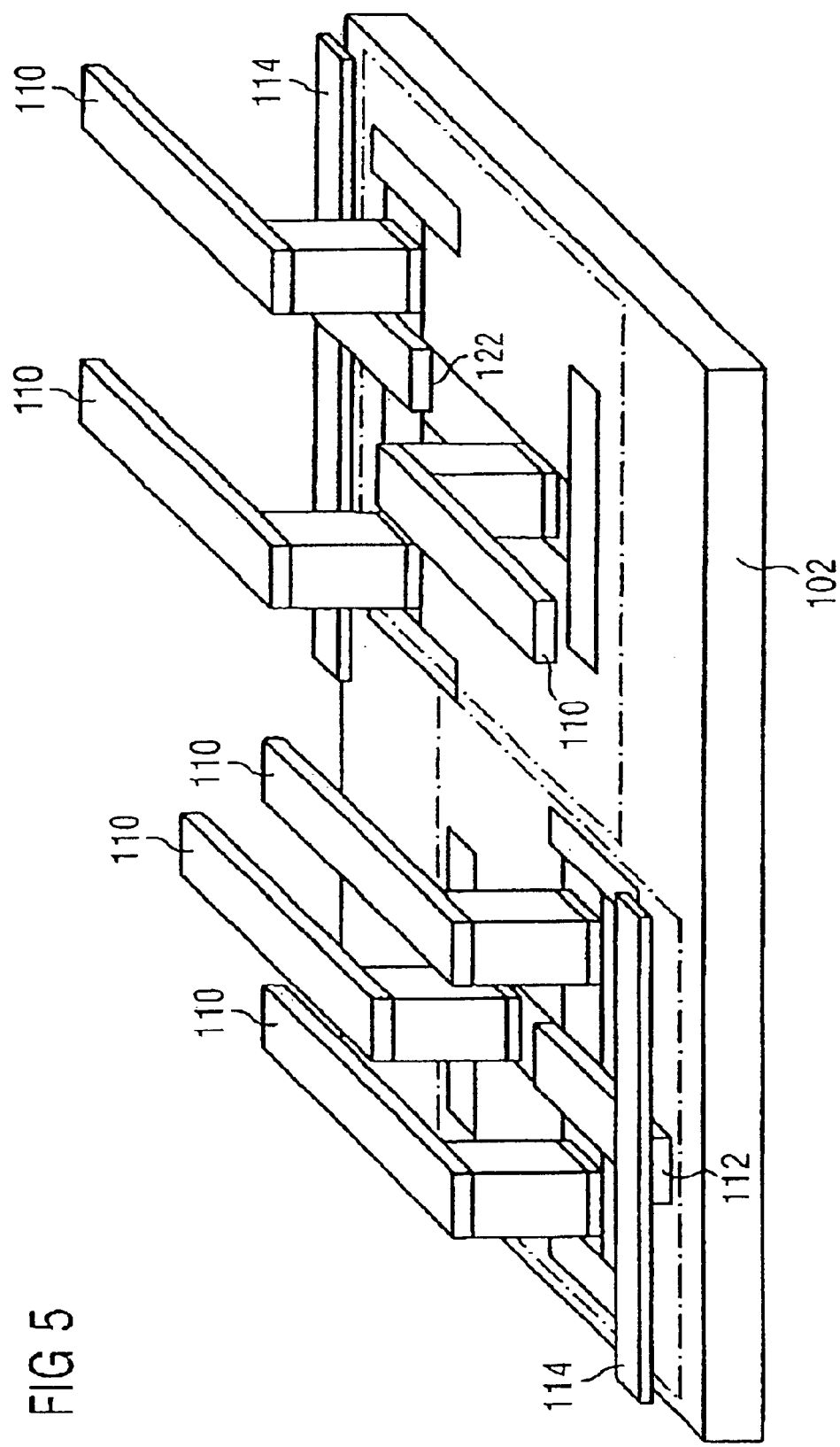
FIG. 5 illustrates a perspective view of adjacent memory unit clusters in a memory array.

Referring to FIG. 5, a portion of a memory array 100 wherein two adjacent memory unit clusters 104 each having three memory units 104A, 104B, 104C with common bitline contacts 112 is shown. The memory unit clusters 104 may be oriented with respect to adjacent memory unit clusters 104 so as to minimize any wasted area or separation between adjacent memory unit clusters 104. By way of example, memory unit clusters 104 may be arranged so as to alternate an orientation of the T-shaped clusters with respect to the adjacent memory unit clusters 104. This arrangement may provide for every second memory unit cluster 104 in a column being connected to the same bitline 114.

Figure 6:
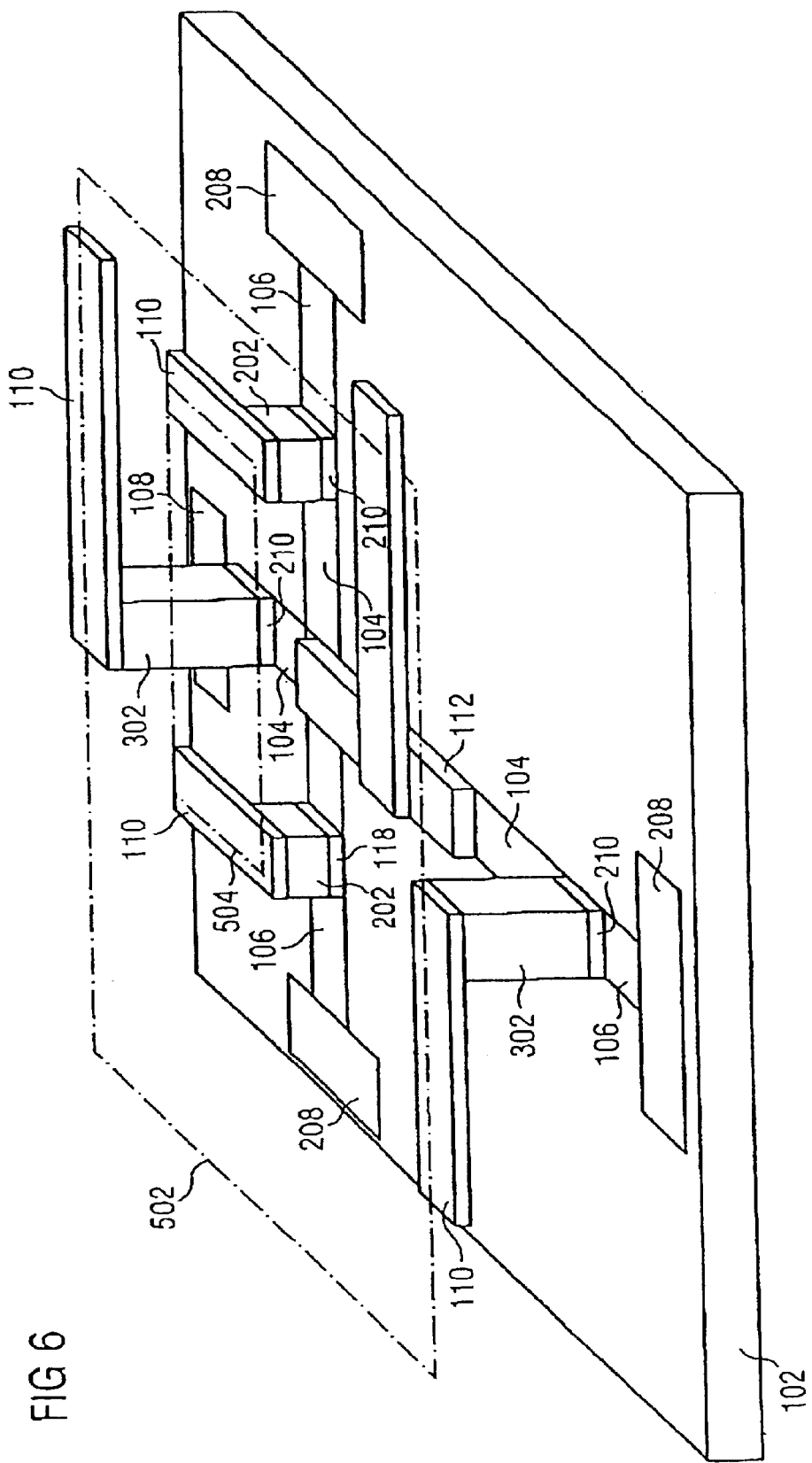
FIG. 6 illustrates a perspective view of an alternate embodiment for a memory unit cluster having wordline contact and a common bitline contact.

Referring now to FIG. 6, a memory unit cluster 104 including four adjacent memory units 104A, 104B, 104C 104D having a common bitline contact 112 is shown. As in FIG. 3, the memory units 104A, 104B, 104C 104D each include an mbit transistor each having a first source/drain region 204, a second source/drain region 206, and a gate formed by the wordline contact 302 and the dielectric layer 210. The first source/drain region 204 is common to each memory unit 104A, 104B, 104C 104D and the second source/drain region 206 is particular to the memory unit 104A, 104B, 104C, 104D. Each mbit transistor is serially connected between the bitline 108 and the capacitive region 208. The bitline contact 112 is disposed between and in electrical contact with the first source/drain region 204 and the bitline 108.

Each memory unit 104A, 104B, 104C, 104D is accessed by the associated wordline 110 via a wordline contact 302 which is disposed between the associated wordline 110 and the dielectric layer 210. In an embodiment, the wordlines 110 may run in a common plane that is disconnected from the surface of the silicon substrate material 102 and is distally located above the bitlines 108, relative to the surface of the silicon substrate material 102. The wordlines 110 may be configured to run parallel with, or at other angles to, the bitline 108.

In another embodiment, two pairs of wordlines 110 form two distinct planes, an upper wordline plane 502 and a lower wordline plane 504. The upper wordline plane 502 is separated from the surface of the silicon substrate material 102 by at least the height of the wordline contact 302 for the two wordlines forming the upper wordline plane 504 and is distally located from the surface of the silicon substrate material 102 relative to the bitlines 108 and the lower wordline plane 502. The lower wordline plane 502 is separated from the surface of the silicon substrate material 102 by at least the height of the wordline contact 302 for the two wordlines forming the lower wordline plane 502 and is distally located from the surface of the silicon substrate material 102 relative to the bitlines 108.

The memory unit cluster having four adjacent memory units 104A, 104B, 104C, 104D with a common bitline contact 112 may be packed tighter and may have a higher density than memory unit clusters having two or three adjacent memory units with a common bitline contact 112. By way of example, with four adjacent memory units 104A, 104B, 104C 104D sharing a common bitline contact 112, the data stored in eight memory units may be accessed by only two bitlines 108.

The memory unit cluster having four memory units 104A, 104B, 104C, 104D may be configured in a "X-Shaped" configuration having a center and four extensions connected to the center. In an embodiment, each of the memory units 104A, 104B, 104C, 104D are at 90 degrees with respect to each other. The first source/drain region 204 may be located substantially at a center of the "X" and the second source/drain region 206 and the capacitive region 208 of each of the four adjacent memory units 104A, 104B, 104C, 104D form one of the four extensions. Those skilled in the art will recognize that the memory units 104A, 104B, 104C 104D may be at other angles, so as to minimize the diffusion area.

Various embodiments of a memory array using a wordline contact have been described and illustrated. However, the description and illustrations are by way of example only. Memory unit clusters having more than two memory units can be formed and provide for tighter packing of the memory array. The memory unit clusters may be arranged so that three, four or more memory units have a common bitline contact. Because memory array designs conventionally include millions of memory units, the wordline contact 202 provides for a substantial space saving for the memory array layout.

Many more embodiments and implementations are possible within the scope of this invention and will be apparent to those of ordinary skill in the art and characteristics for the electrical and electronic elements described herein may be varied to implement a memory array within the scope of this invention. For example, it is possible to configure the memory unit within the scope of this invention to provide freedom to orient wordlines within the memory array independent of the orientation of bitlines and other components of the memory array. In addition, various electrical and electronic components may be combined to implement a memory unit within the scope of this invention. While the embodiments have been described with respect to memory array 100 having trench capacitors, those skilled in the art will recognize that the advantages may be extended to various types of memory arrays, such as memory array having stack capacitor arrays or any other type of memory storage devices. The DRAM memory unit may be used with any device requiring high-density, low cost data storage devices. Therefore, the invention is not limited to the specific details, representative embodiments, and illustrated examples in this description. Accordingly, the invention is not to be restricted except in light as necessitated by the accompanying claims and their equivalents.

What is claimed is:

1. A semiconductor memory array having a silicon substrate material having a surface, comprising:
   a first memory unit including a first memory bit ("mbit") transistor;
   a second memory unit including a second mbit transistor having a common source/drain region with the first mbit transistor;
   a bitline in electrical contact with the common source/drain region via a bitline contact, wherein the bitline contact is shared by the first mbit transistor and the second mbit transistor; and
   a first wordline in electrical contact with the first mbit transistor via a wordline contact, the wordline contact being disposed between the first wordline and a dielectric layer disposed at the surface of the substrate material.

2. The semiconductor memory array of claim 1, comprising:
   a second wordline in electrical contact with the second mbit transistor via a wordline contact, the wordline contact being disposed between the second wordline and a dielectric layer disposed at the surface of the substrate material.

3. The semiconductor memory array of claim 1, comprising:
   a third memory unit including a third mbit transistor having a common source/drain region with the first mbit transistor and the second mbit transistor; and
   a third wordline in electrical contact with the second mbit transistor via a wordline contact, the wordline contact being disposed between the third wordline and a dielectric layer disposed at the surface of the substrate material.

4. The semiconductor memory array of claim 3, comprising:
   a fourth memory unit including a fourth mbit transistor having a common source/drain region with the first mbit transistor, the second mbit transistor and the third mbit transistor; and
   a fourth wordline in electrical contact with the fourth mbit transistor via a wordline contact, the wordline contact being disposed between the fourth wordline and a dielectric layer disposed at the surface of the substrate material.

5. The semiconductor memory array of claim 1, comprising a second wordline being in electrical contact with the second mbit transistor, where the first wordline runs in a plane being distally located from the second wordline.

6. The semiconductor memory array of claim 1, where the first wordline runs in a plane that is more proximate the surface of the silicon substrate material than a bitline.

7. The semiconductor memory array of claim 1, where the first wordline runs non-parallel to a second wordline in electrical contact with the second mbit transistor.

8. A semiconductor memory array having a silicon substrate material having a surface, comprising:
   a first source/drain region;
   a second source/drain region, wherein the first source/drain region and the second source/drain region form a first channel region adjoining the surface of the silicon substrate material, and being formed between the first source/drain region and the second source/drain region;
   a dielectric layer disposed at the surface of the silicon substrate material at the first channel region;
   a bitline in electrical contact with the first source drain region via a bitline contact;
   a first capacitive region being in electrical contact with the second source/drain region;
   a first wordline distally located from the bitline relative to the surface of the silicon substrate material; and
   a wordline contact disposed between the dielectric layer and the first wordline.

9. The semiconductor memory array of claim 8, comprising:
   a third source/drain region, wherein the first source/drain region and the third source/drain region form a second channel region adjoining the surface of the silicon substrate material, and being formed between the first source/drain region and the third source/drain region;
   a dielectric layer disposed at the surface of the silicon substrate material at the second channel region;
   a second capacitive region being in electrical contact with the third source/drain region;
   a second wordline above the bitline relative to the surface of the silicon substrate material; and
   a wordline contact disposed between the dielectric layer and the second wordline.

10. The semiconductor memory array of claim 9, comprising:
    a fourth source/drain region, wherein the first source/drain region and the fourth source/drain region form a third channel region adjoining the surface of the silicon substrate material, and being formed between the first source/drain region and the fourth source/drain region;
    a dielectric layer disposed at the surface of the silicon substrate material at the third channel region;
    a third capacitive region formed in the silicon substrate material and being in electrical contact with the fourth source/drain region;
    a third wordline above the bitline relative to the surface of the silicon substrate material; and
    a wordline contact disposed between the dielectric layer and the third wordline.

11. The semiconductor memory array of claim 10, comprising:
    a fifth source/drain region, wherein the first source/drain region and the fifth source/drain region form a fourth channel region adjoining the surface of the silicon substrate material, and being formed between the first source/drain region and the fifth source/drain region;
    a dielectric layer disposed at the surface of the silicon substrate material at the fourth channel region;
    a fourth capacitive region formed in the silicon substrate material and being in electrical contact with the fifth source/drain region;
    a fourth wordline above the bitline relative to the surface of the silicon substrate material; and
    a wordline contact disposed between the dielectric layer and the fourth wordline.

12. The semiconductor memory array of claim 9 wherein the dielectric layer comprises an oxide material.

13. The semiconductor memory array of claim 9 wherein the first wordline, the second wordline, are parallel.

14. The semiconductor memory array of claim 13 wherein the first wordline, the second wordline, run orthogonal to the bitline.

15. The semiconductor memory array of claim 9 wherein the first wordline and the second wordline form a first wordline layer and form a wordline layer disconnected from the surface of the silicon substrate material.

16. The semiconductor memory array of claim 8, where the first wordline runs in a plane being distally located from a second wordline.

17. The semiconductor memory array of claim 8, where the wordline runs in a plane being more proximate the surface of the silicon substrate material than the bitline.

18. The semiconductor memory array of claim 8, where the first wordline runs non-parallel to a second wordline.

19. A DRAM memory array having a plurality of DRAM memory units arranged in memory unit clusters wherein each memory unit cluster comprises at least two memory units having a common bitline contact, and a first wordline being in electrical contact with at least one of the at least two memory units via a wordline contact.

20. The DRAM memory array of claim 19 where each DRAM memory unit comprises:
   a memory bit (mbit) transistor having a first terminal, a second terminal and a third terminal, the first terminal being electrically coupled to the bitline via the bitline contact, and the second terminal being electrically coupled to the wordline via a dielectric material and the wordline contact; and
   a capacitor coupled to the third terminal of the transistor.

21. The DRAM memory array of claim 20 wherein the wordline runs in a plane that is more proximate the second terminal than the distance between the first terminal and the bitline.

22. The semiconductor memory array of claim 19, comprising a second wordline being in electrical contact with at least one of the at least two memory units, where the first wordline runs in a plane being distally located from the second wordline.

23. The DRAM memory array of claim 19, comprising a second wordline being in electrical contact with at least one of the at least two memory units, where the first wordline runs non-parallel to the second wordline.

24. A semiconductor memory comprising a plurality of memory units where a first memory unit is configured to store data, where the first memory unit is accessed by a wordline being in electrical contact with the first memory unit via a wordline contact disposed between the first memory unit and the wordline, and where the data stored by the first memory unit is read via a bitline in electrical contact with the first memory unit via a bitline contact common to the first memory unit and at least a second memory unit.

25. The semiconductor memory of claim 24, where the wordline runs in a plane that is more proximate the memory unit than the bitline.

26. The semiconductor memory of claim 24, comprising a second wordline being in electrical contact with the second memory unit, where the first wordline runs non-parallel to the second wordline.

* * * * *